(12) United States Patent
Huang et al.

(10) Patent No.: US 12,685,109 B2
(45) Date of Patent: Jul. 14, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Yen-Chih Huang, Hsinchu (TW); Li-An Sun, Hsinchu (TW); Chih-Hao Chen, Hsinchu (TW); Chung-Chuan Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 360 days.

(21) Appl. No.: 18/238,049

(22) Filed: Aug. 25, 2023

(65) Prior Publication Data

US 2025/0069989 A1     Feb. 27, 2025

(51) Int. Cl.
*H10W 20/00* (2026.01)

(52) U.S. Cl.
CPC ....... *H10W 20/056* (2026.01); *H10W 20/074* (2026.01); *H10W 20/075* (2026.01); *H10W 20/076* (2026.01); *H10W 20/096* (2026.01); *H10W 20/033* (2026.01)

(58) Field of Classification Search
CPC ............. H10W 20/033; H10W 20/074; H10W 20/075; H10W 20/076; H10W 20/096
See application file for complete search history.

(56) References Cited

U.S. PATENT DOCUMENTS

| | | | | |
|---|---|---|---|---|
| 7,074,718 B2 * | 7/2006 | Kim | .................. | H10W 20/0698 257/E21.507 |
| 7,101,785 B2 * | 9/2006 | Hilliger | ................. | H10W 20/42 257/E23.145 |
| 7,820,508 B2 * | 10/2010 | Oh | ......................... | H10D 1/042 257/E21.252 |
| 10,217,707 B2 * | 2/2019 | Bi | ........................ | H10D 62/151 |
| 10,242,994 B2 * | 3/2019 | Inomata | ................ | H10B 41/27 |
| 10,510,759 B2 * | 12/2019 | Kim | ..................... | H10B 12/315 |
| 11,251,128 B2 * | 2/2022 | Shih | .................... | H10W 20/072 |
| 12,255,094 B2 * | 3/2025 | Lim | ..................... | H10W 20/074 |
| 12,349,352 B2 * | 7/2025 | Fujimura | .............. | H10B 43/27 |
| 2022/0392800 A1 * | 12/2022 | Lim | .................... | H10W 20/074 |
| 2022/0392841 A1 * | 12/2022 | Kang | .................. | H10W 20/082 |
| 2023/0307370 A1 * | 9/2023 | Lee | ..................... | H10W 20/083 |

FOREIGN PATENT DOCUMENTS

| | | | | |
|---|---|---|---|---|
| KR | 101060562 B1 * | 8/2011 | .......... | H10W 20/032 |
| WO | WO-2022033100 A1 * | 2/2022 | ............ | H10W 20/43 |

* cited by examiner

*Primary Examiner* — David A Zarneke
(74) *Attorney, Agent, or Firm* — Birch, Stewart, Kolasch & Birch, LLP

(57) ABSTRACT

A semiconductor device includes a FEOL structure and a BEOL structure. The BEOL structure is formed over the FEOL structure and includes a conductive layer, an etching stop layer (ESL) structure, a through via and a barrier layer. The ESL structure is formed over the conductive layer and has a first recess and a lateral surface. The through via passes through the ESL structure to form the first recess and the lateral surface. The barrier layer covers the lateral surface and the first recess. The first recess is recessed with respect to the lateral surface, and the first recess has a first depth ranging between 1 nm and 7 nm.

20 Claims, 12 Drawing Sheets

SEMICONDUCTOR DEVICE AND MANUFACTURING METHOD THEREOF

BACKGROUND

A semiconductor device normally includes at least one transistor, and a conductive layer is electrically connected to the transistors by filling a through via with a metal material. In order to ensure the quality of the electrical connection, the forming quality of the conductive layer is important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
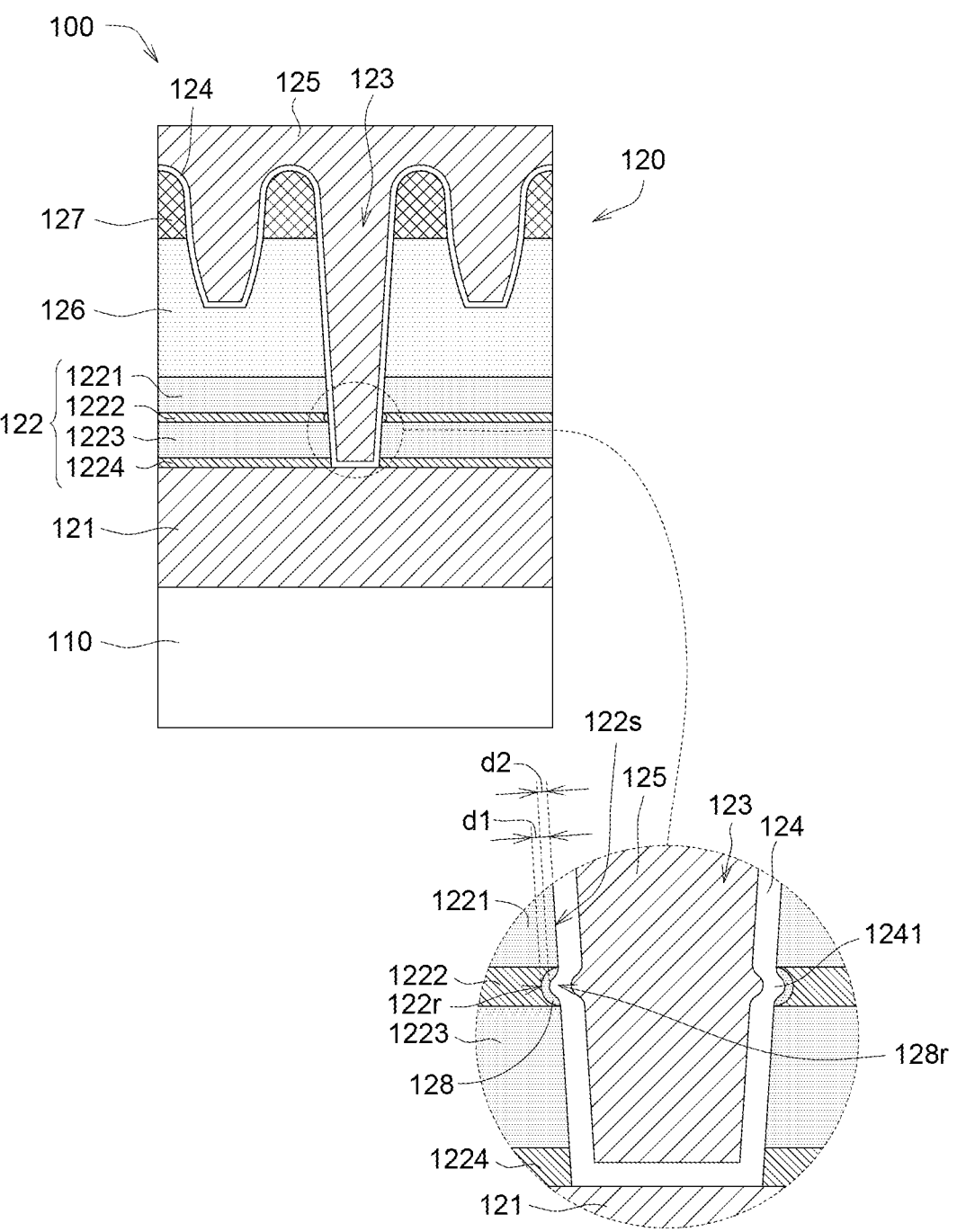
FIG. 1 illustrates a schematic diagram of a cross-sectional view of a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, FIG. 1 illustrates a schematic diagram of a cross-sectional view of a semiconductor device 100. The semiconductor device 100 may include a FEOL (Front End of Line) structure 110 and a BEOL structure 120 formed over the FEOL structure 110. The BEOL structure 120 includes a first conductive layer 121, an etching stop layer (ESL) structure 122, at least through via 123, a barrier layer (or diffusion barrier layer) 124, a second conductive layer 125, a first oxide layer 126, a second oxide layer 127 and a filling portion (or stuffing) 128. The ESL structure 122 is formed over the first conductive layer 121 and has a first recess 122r and a lateral surface 122s. The through via 123 passes through the ESL structure 122 to form the first recess 122r and the lateral surface 122s. The barrier layer 124 covers the lateral surface 122s and the first recess 122r. The second conductive layer 125 is formed on the barrier layer 124. The first recess 122r is recessed with respect to the lateral surface 122s, and the first recess 122r has a first depth d1 ranges between, for example, 1 nanometer (nm) and 7 nm, for example, 1 nm, 2 nm, 3 nm, 4 nm, 5 nm, 6 nm or 7 nm. Due to the sufficiently small first depth d1 (for example, less than 3 nm), the barrier layer 124 may include a continuous portion 1241 corresponding to the first recess 122r, and thus the yield and reliability of the semiconductor device 100 may be increased.

As illustrated in FIG. 1, the first conductive layer 121 is electrically connected to the FEOL structure 110 through at least one metal via which is electrically to an electrode of a transistor. Furthermore, the first conductive layer 121 may be defined as Metal 0(M0). In addition, the first conductive layer 121 may be formed from a material including, for example, copper.

As illustrated in FIG. 1, the ESL structure 122 includes a first ESL 1221, a second ESL 1222, a third ESL 1223 and a fourth ESL 1224. The second ESL 1222 is formed between the first ESL 1221 and the third ESL 1223, the third ESL 1223 is formed between the second ESL 1222 and the fourth ESL 1224, the fourth ESL 1224 is formed between the first conductive layer 121 and the third ESL 1223, and the first recess 122r is formed corresponding the second ESL 1222. In other words, the first recess 122r has the second ESL 1222.

As illustrated in FIG. 1, the first ESL 1221 may be formed from a low-K material, for example, silicon oxide, silicon carbon, etc. The first ESL 1221 may serve as an etching deceleration layer. Furthermore, the first ESL 1221 has an etching rate slower than that of the first oxide layer 126 for a specific etchant. The third ESL 1223 may be formed from a material the same as that of the first ESL 1221. In addition, the second ESL 1222 may be formed from a metal oxide, for example, $AlO_x$, etc. The fourth ESL 1224 may be formed from a material the same as that of the second ESL 1222. The $AlO_x$ ESL (for example, the second ESL 1222) may have high selectivity during etching low-K or oxide material (for example, the first ESL 1221) but easy to be removed by the wet clean process.

As illustrated in FIG. 1, the through via 123 passes the first ESL 1221, the second ESL 1222, the third ESL 1223 and the fourth ESL 1224, so that the first ESL 1221 and/or the third ESL 1223 form the lateral surface 122s.

As illustrated in FIG. 1, the barrier layer 124 is, for example, a single and contiguous layer due to the first depth d1 less than 7 nm. As a result, it could prevents the second conductive layer 125 formed on the barrier layer 124 from being damaged, for example, cracked, broken. In addition, the barrier layer 124 may be formed from a material including, TaN, etc.

As illustrated in FIG. 1, the second conductive layer 125 fills the through via 123 and is formed on the barrier layer 124. The second conductive layer 125 may be formed from a material including, for example, copper.

As illustrated in FIG. 1, the first oxide layer 126 may be formed from a material including, for example, a low-K material, for example, silicon oxide, etc. The second oxide layer 127 is formed on the first oxide layer 126. The second oxide layer 127 may be formed from, for example, silicon oxide.

As illustrated in FIG. 1, the filling portion 128 is formed within the first recess 122r and has a second recess 128r recessed with respect to the lateral surface 122s. The second recess 128r has a second depth d2 less than the first depth d1. For example, the second depth d2 less than, for example, 6 nm, for example, 0 nm (no recess), 1 nm, 2 nm, 3 nm, 4 nm, 5 nm or 6 nm. The filling portion 128 is formed from a material the same as that of the ESL structure 122. For example, the filling portion 128 is formed from a material the same as that of the first ESL 1221 and/or the third ESL 1223 of the ESL structure 122. Furthermore, in a manufacturing process of the semiconductor device 100, the first ESL 1221 and/or the third ESL 1223 may be bombarded by using dry etching, and then the filling portion 128 is formed by a sputtered material of the first ESL 1221 and/or a sputtered material of the third ESL 1223. In another embodiment, the semiconductor device 100 may omit the filling portion 128. Furthermore, the filling portion 128 may be removed in process of etching the third ESL 1223 or be omitted if the first depth d1 of the first recess 122r is less than 3 nm.

Figure 2:
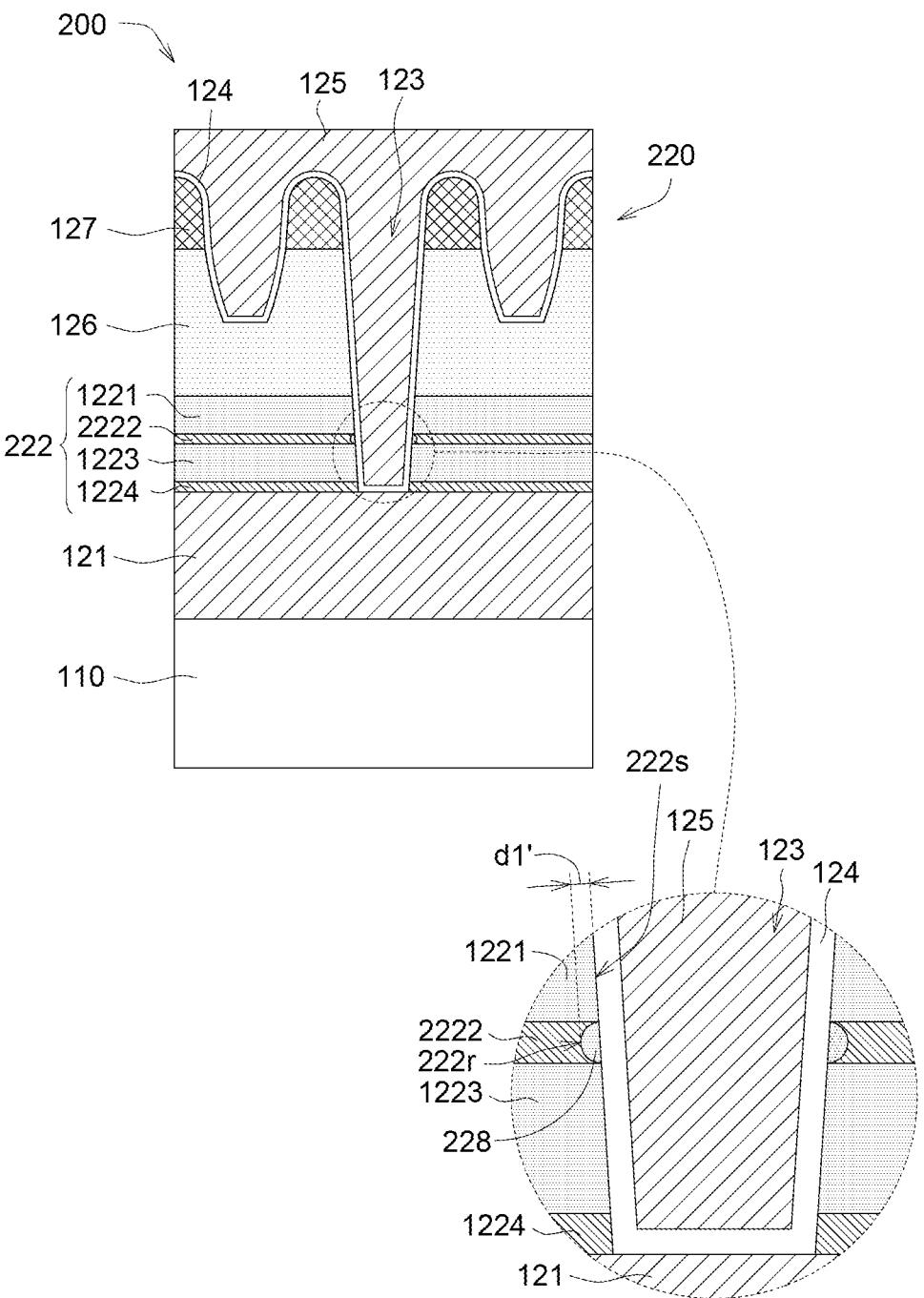
FIG. 2 illustrates a schematic diagram of a cross-sectional view of a semiconductor device according to another embodiment of the present disclosure.

Referring to FIG. 2, FIG. 2 illustrates a schematic diagram of a cross-sectional view of a semiconductor device 200. The semiconductor device 200 may include the FEOL structure 110 and a BEOL structure 220 formed over the FEOL structure 110. The BEOL structure 220 includes the first conductive layer 121, a ESL structure 222, at least through via 123, the barrier layer 124, the second conductive layer 125, the first oxide layer 126, the second oxide layer 127 and a filling portion 228. The ESL structure 222 is formed over the first conductive layer 121 and has a lateral surface 222s and a lateral surface 222s. The through via 123 passes through the ESL structure 222 to form the first recess 222r and the lateral surface 222sr. The barrier layer 124 covers the lateral surface 222s and the first recess 222r. The second conductive layer 125 is formed within the through via 123. The first recess 222r is recessed with respect to the lateral surface 222s, and the first recess 222r has a first depth d1'.

In the present embodiment, the first depth d1' may be equal to or less the aforementioned first depth d1. The filling portion 228 filling the first recess 222r may not have recess. Furthermore, the filling portion 228 may omit the aforementioned second recess 128r. In another embodiment, the filling portion 228 may have a second recess recessed with respect to the lateral surface 222s, and the second recess has a second depth less than the aforementioned second depth d2.

In another embodiment, the semiconductor device 200 may omit the filling portion 228. Furthermore, the filling portion 228 may be removed in process of etching the third ESL 1223 or be omitted if the first depth d1' of the first recess 222r is less than 3 nm.

Referring to FIGS. 3A to 3J, FIGS. 3A to 3J illustrate schematic diagrams of manufacturing processes of the semiconductor device 100 in FIG. 1.

Figure 3A:
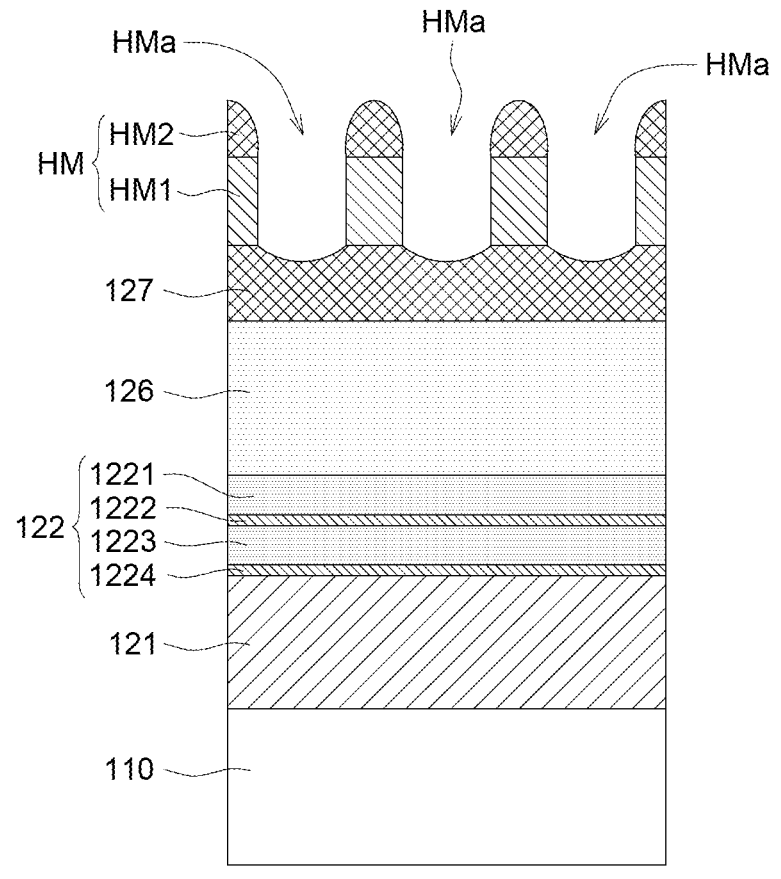
FIGS. 3A to 3J illustrate schematic diagrams of manufacturing processes of the semiconductor device in FIG. 1.

As illustrated in FIG. 3A, the FEOL structure 110 is formed. Then, the BEOL structure 120 over the FEOL structure 110 is formed.

The forming of the BEOL structure 120 includes the steps: the first conductive layer 121 which is electrically connected to the FEOL structure 110 is formed, then the ESL structure 122 over the first conductive layer 110 is formed, then the first oxide layer 126 over the ESL structure 122 is formed, then the second oxide layer 127 over the first oxide layer 126 is formed, and then a pattern hard mask HM over the second oxide layer 127 is formed. The hard mask HM includes a first mask layer HM1 and a second mask layer HM2, wherein the first mask layer HM1 is formed on the second oxide layer 127, and the second mask layer HM2 is formed on the first mask layer HM1. The hard mask HM has a plurality of opening HMa to expose a plurality of trench define region in the second oxide layer 127.

Figure 3B:
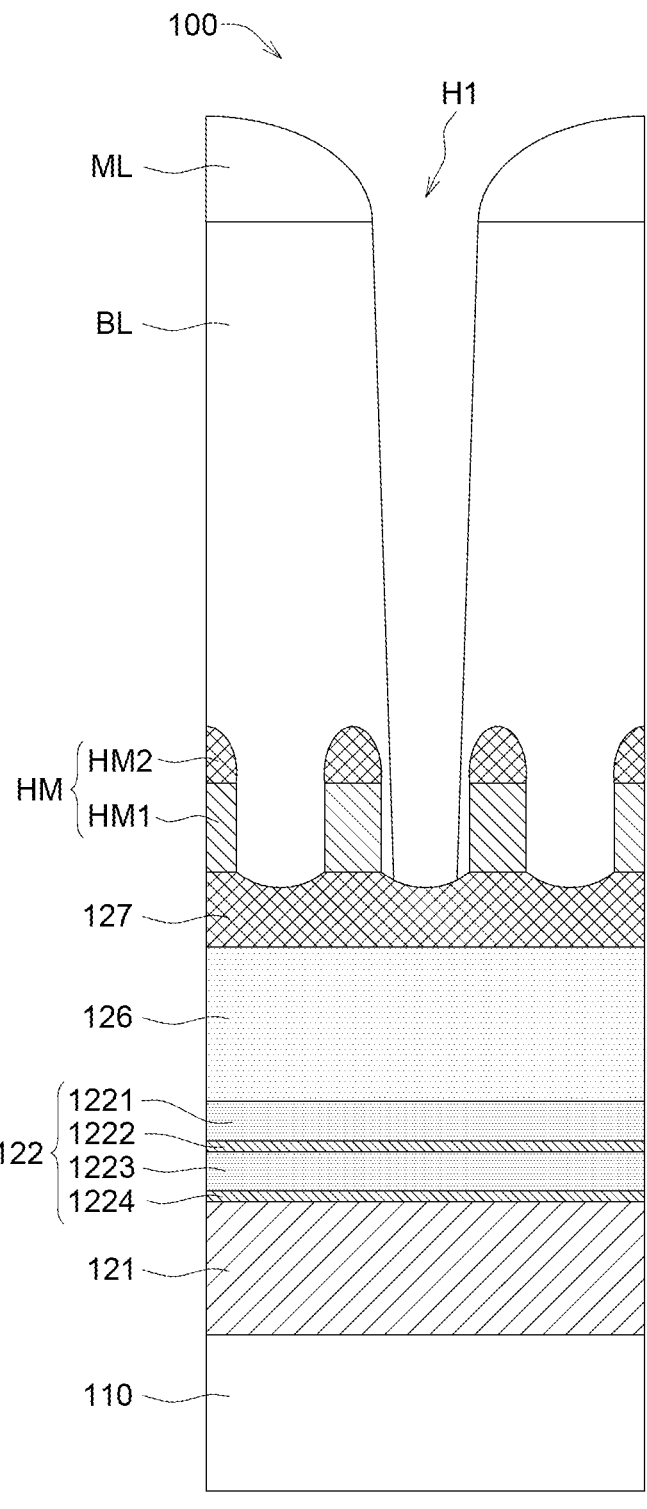

As illustrated in FIG. 3B, a patterned bottom layer BL on the pattern hard mask HM is formed, and a patterned middle layer ML on the patterned bottom layer BL is formed, wherein the patterned bottom layer BL and the patterned middle layer ML have at least one opening H1 exposing at least one opening HMa for defining a region of the through via 123 (illustrated in FIG. 1).

Figure 3C:
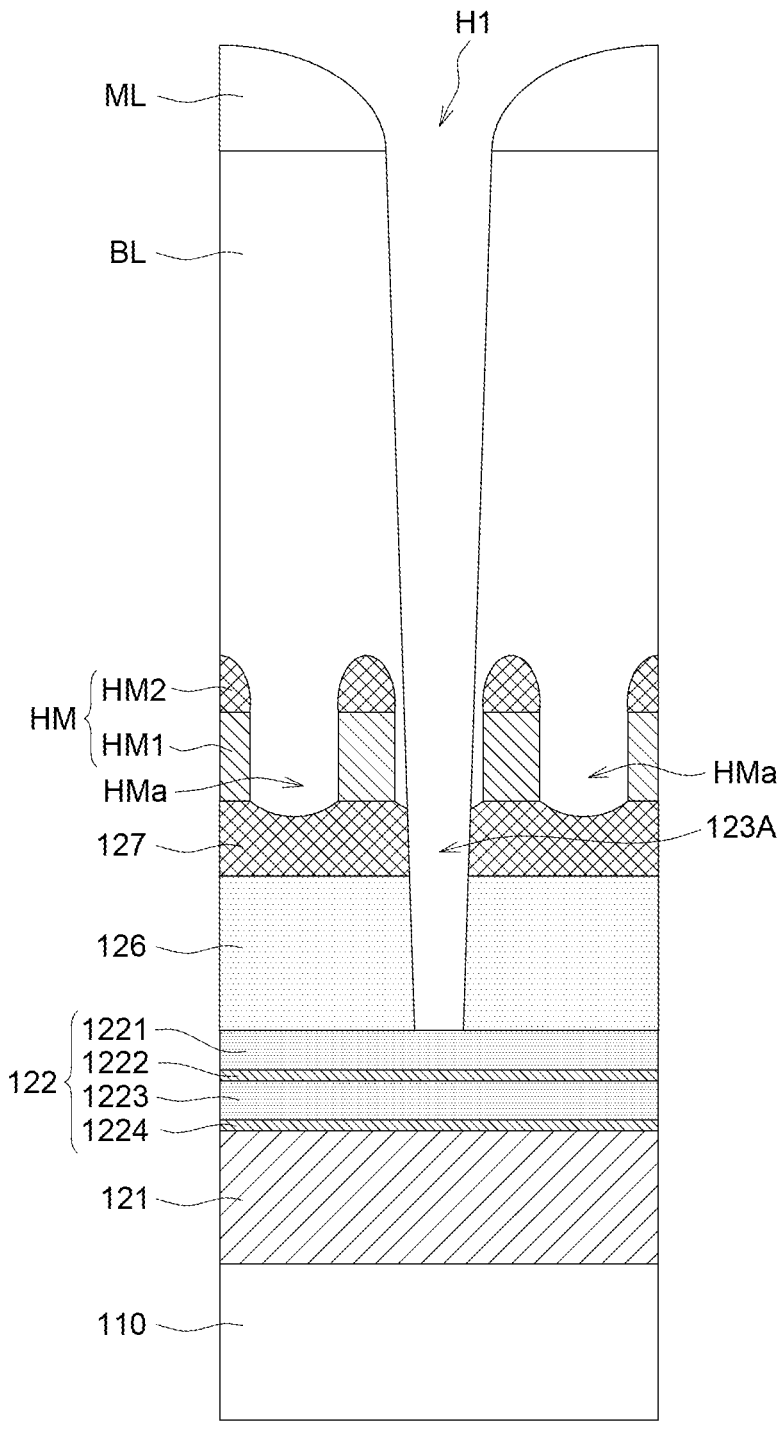

As illustrated in FIG. 3C, at least one hole 123A passing through the second oxide layer 127 and the first oxide layer 126 is formed through the opening H1 by using etching. The hole 123A stops at the first ESL 1221.

Figure 3D:
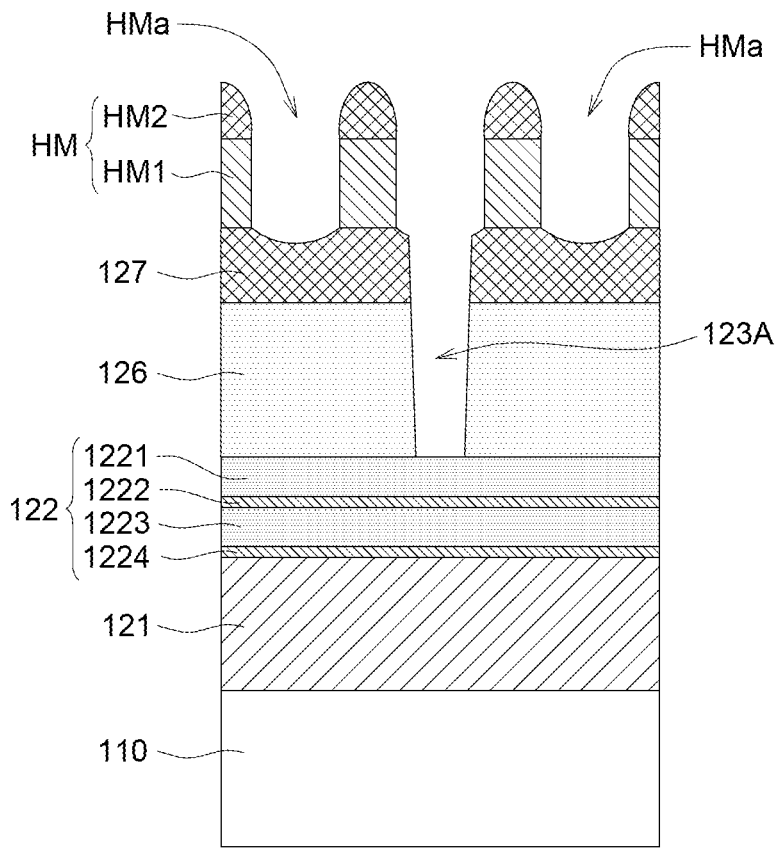

As illustrated in FIG. 3D, the patterned bottom layer BL and the patterned middle layer ML in FIG. 3C are removed to expose the openings HMa which are covered by the patterned bottom layer BL in FIG. 3C.

Figure 3E:
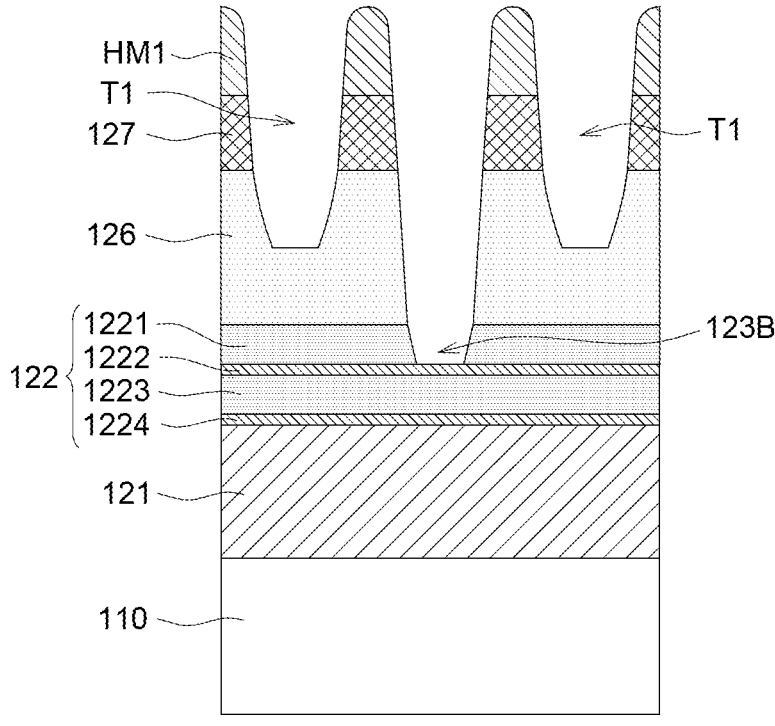

As illustrated in FIG. 3E, at least one hole 123B passing through the first ESL 1221 is formed by using, for example, dry etching. The hole 123B stops at the second ESL 1222. During etching the first ESL 1221, a portion of the second oxide layer 127 and a portion of the first oxide layer 126 are removed to form at least one trench T1 corresponding to the openings HMa which are covered by the patterned bottom layer BL in FIG. 3C.

The first ESL 1221 may serve as an etching deceleration layer. Furthermore, the first ESL 1221 has an etching rate slower than that of the first oxide layer 126 for a specific etchant. As a result, the trench T1 (substantial sum of the thickness of the second oxide layer 127 and a portion of thickness of the first oxide layer 126) deeper than that of the hole 123B (the thickness of the hole 123B) may be formed in etching process for the first ESL 1221.

Figure 3F:
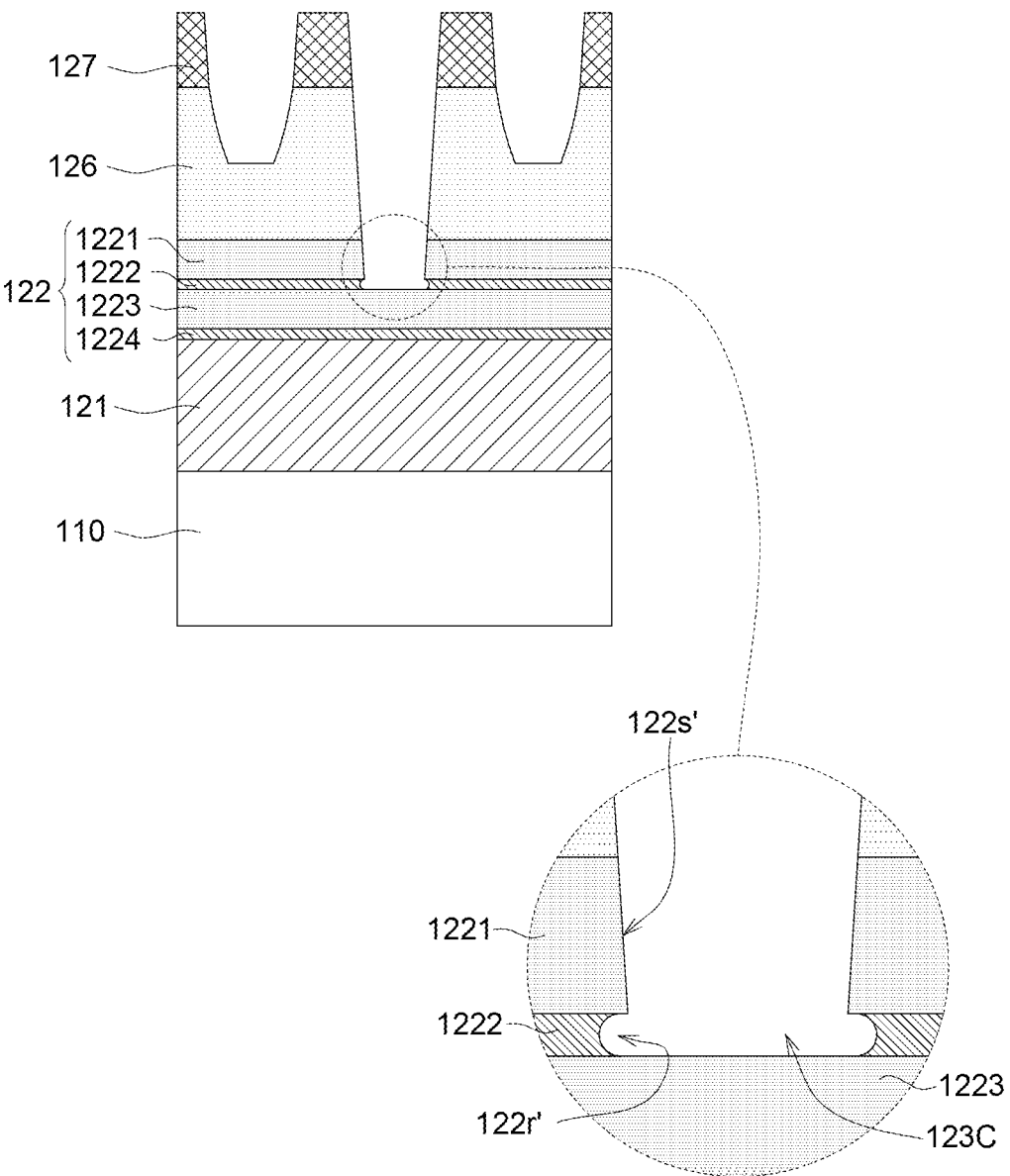

As illustrated in FIG. 3F, at least one hole (first hole) 123C passing through the second ESL 1222 is formed by using wet clean process. The hole 123C stops at the third ESL 1223. The second ESL 1222 forms a first recess 122r' recessed with respect to a lateral surface 122s' of the first ESL 1221.

Figure 3G:
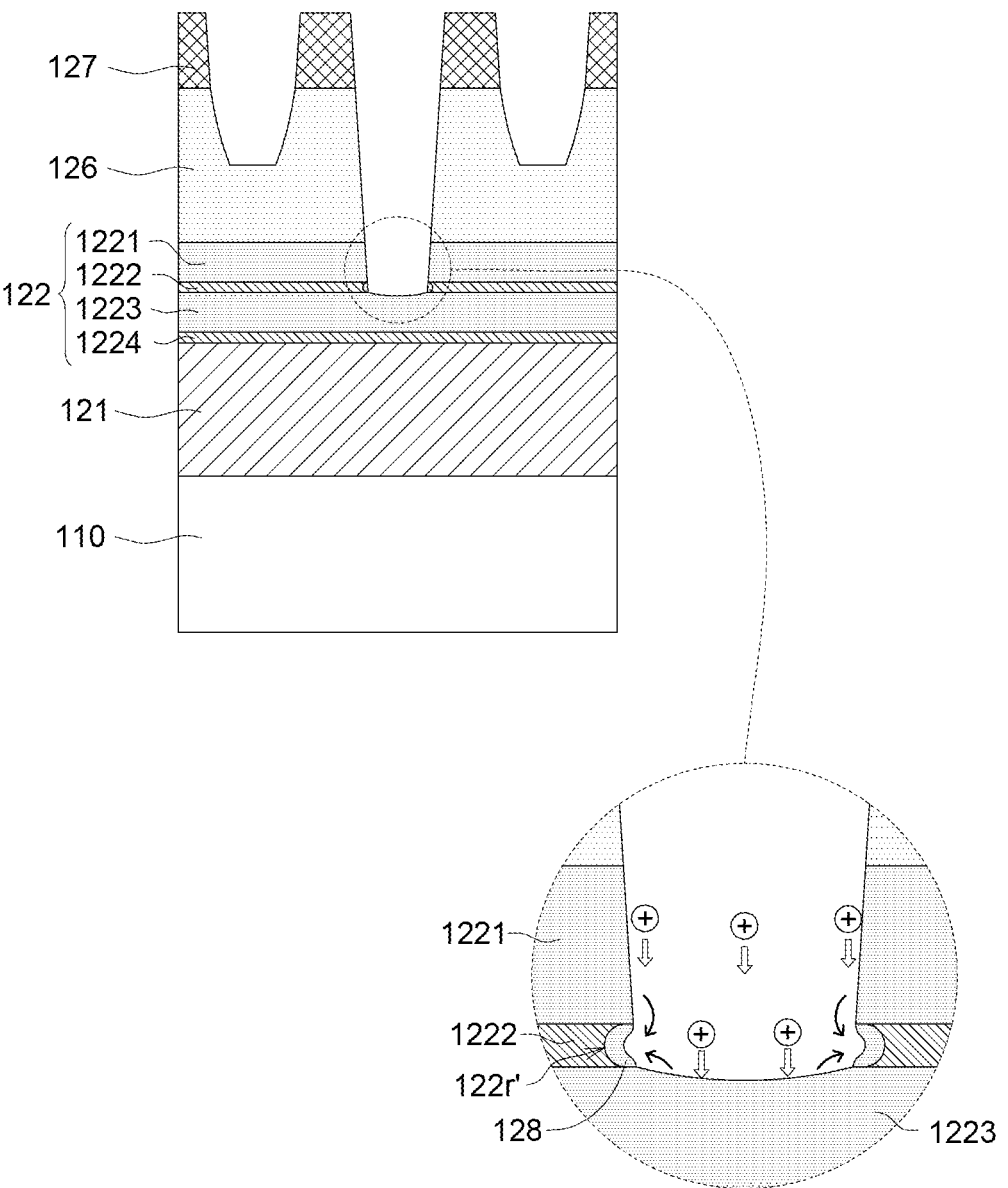

As illustrated in FIG. 3G, by using, for example, a dry etching, the first ESL 1221 and/or the third ESL 1223 may be bombarded, and then the filling portion 128 is formed by a sputtered material of the first ESL 1221 and/or a sputtered material of the third ESL 1223. In an embodiment, the dry etching is accomplished by Argon ion plasma. The filling portion 128 fills a portion of the first recess 122r'. Furthermore, the filling portion 128 has the second recess 128r recessed with respect to the lateral surface 122s. The second recess 128r has the second depth d2 less than the first depth d1. In another embodiment, the filling portion 128 may fill the entire of the first recess 122r'.

Figure 3H:
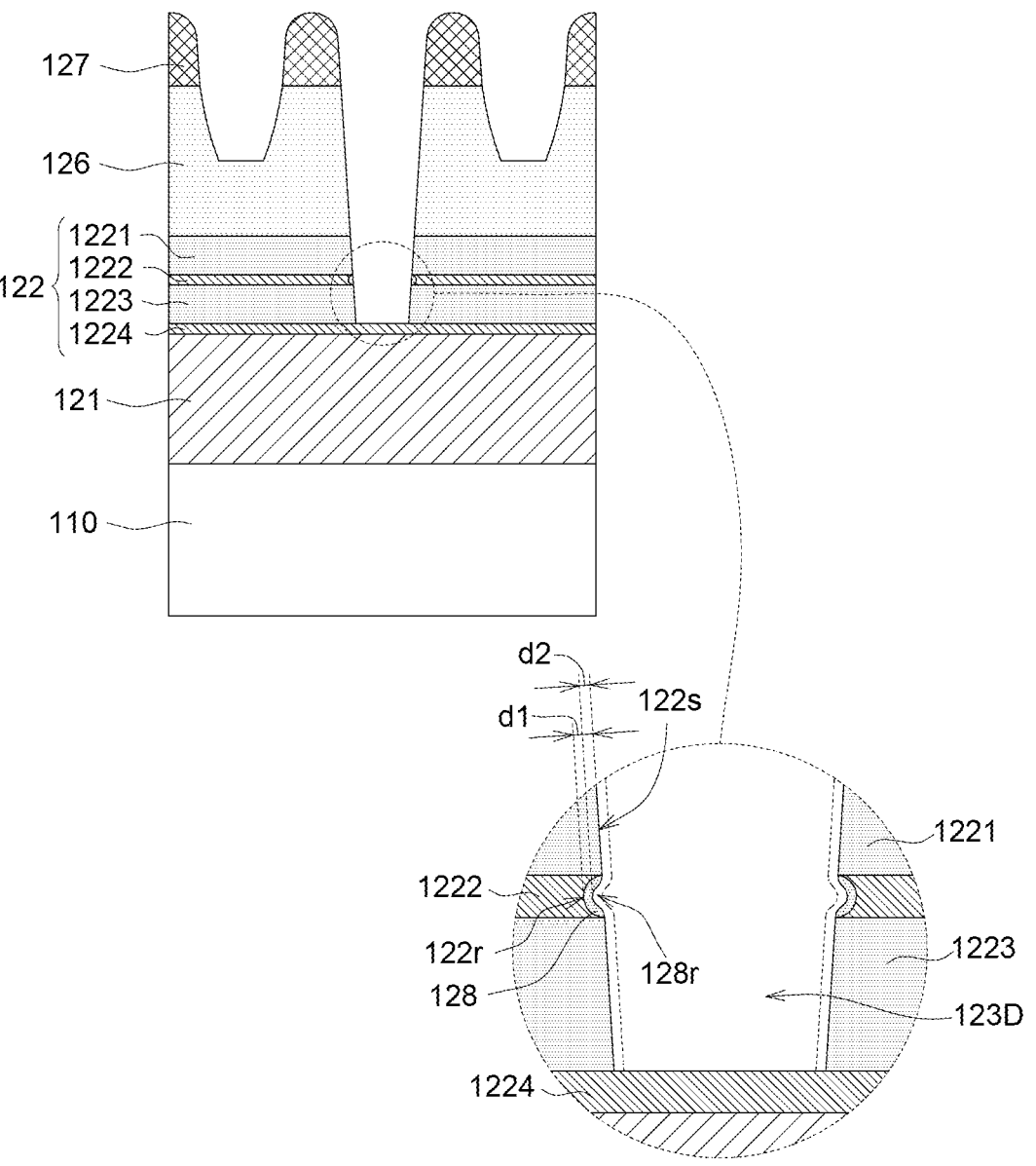

In addition, if the depth of the first recess 122r' in FIG. 3F is less than 3 nm, the filling portion 128 in FIG. 3G may not be formed (for example, process of FIG. 3G may be omitted) or the filling portion 128 formed in FIG. 3G may be removed in FIG. 3H.

As illustrated in FIG. 3H, at least one hole 123D passing through the third ESL 1223 is formed by using, for example, a dry etching. The hole 123D stops at the fourth ESL 1224. During etching the third ESL 1223, a portion of sidewall of the first ESL 1221 and at least one portion of the filling portion 128 are removed to expand diameter of the hole. After etching, the second ESL 1222 has the first recess 122*r* having the first depth d1. During etching, a portion of the first ESL 1221, a portion of the third ESL 1223 and a portion of the filling portion 128 are removed, so that the second ESL 1222 forms the first recess 122*r* having the first depth d1, and the filling portion 128 forms the second recess 128*r* having the second depth d2.

Figure 3I:
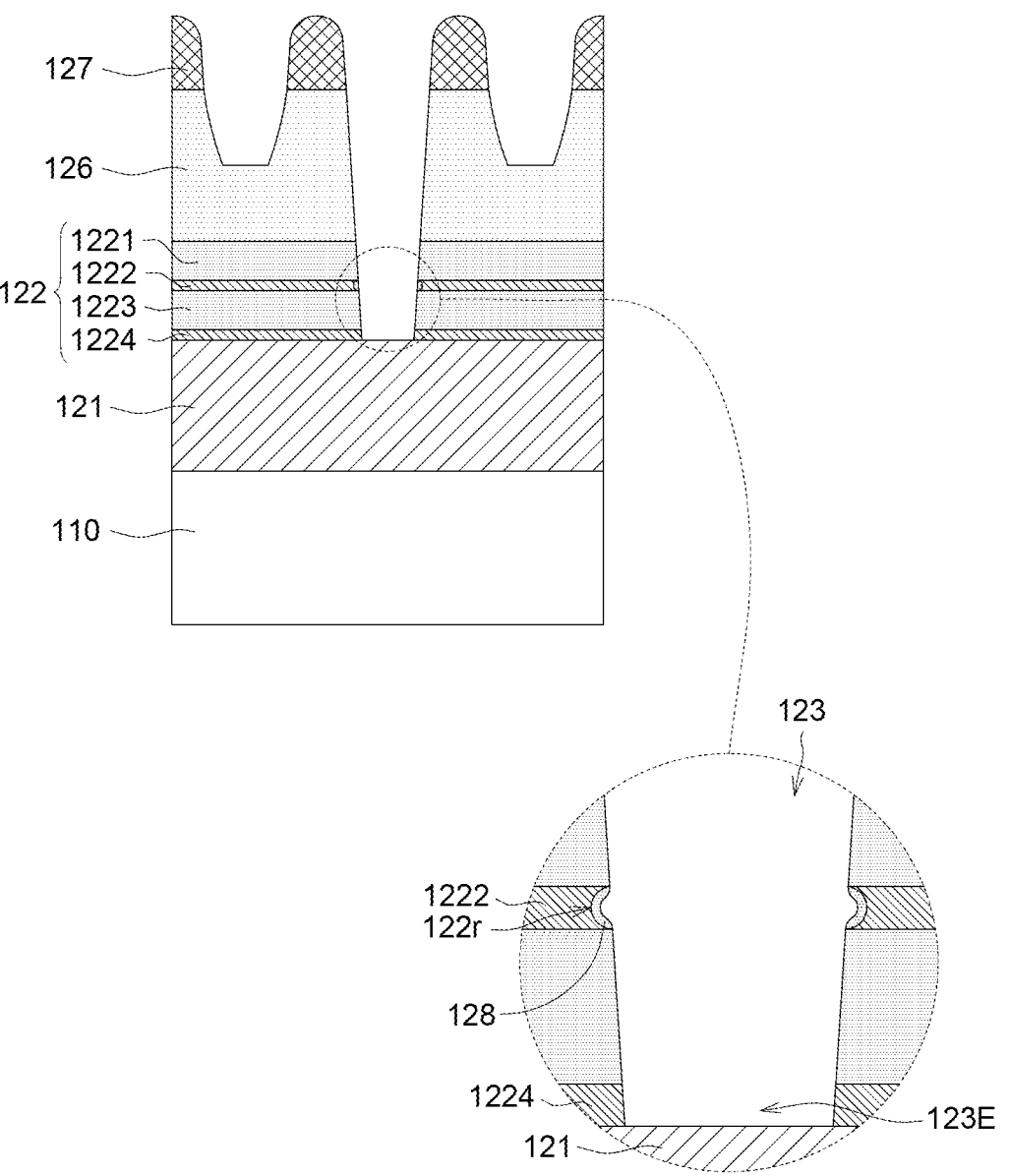

As illustrated in FIG. 3I, at least one hole (second hole) 123E passing through the fourth ESL 1224 is formed by using wet clean process. The hole 123D may stop at the first conductive layer 121 to expose the first conductive layer 121. After the hole 123E is formed, the through via 123 passing the ESL structure 122 and exposing the first conductive layer 121 is formed. In other words, the through via 123 is formed through or by the aforementioned holes. Due to the protection (or covering) of the filling portion 128, the material of the second ESL 1222 may not be removed (or etched) during etching for the fourth ESL 1224.

Figure 3J:
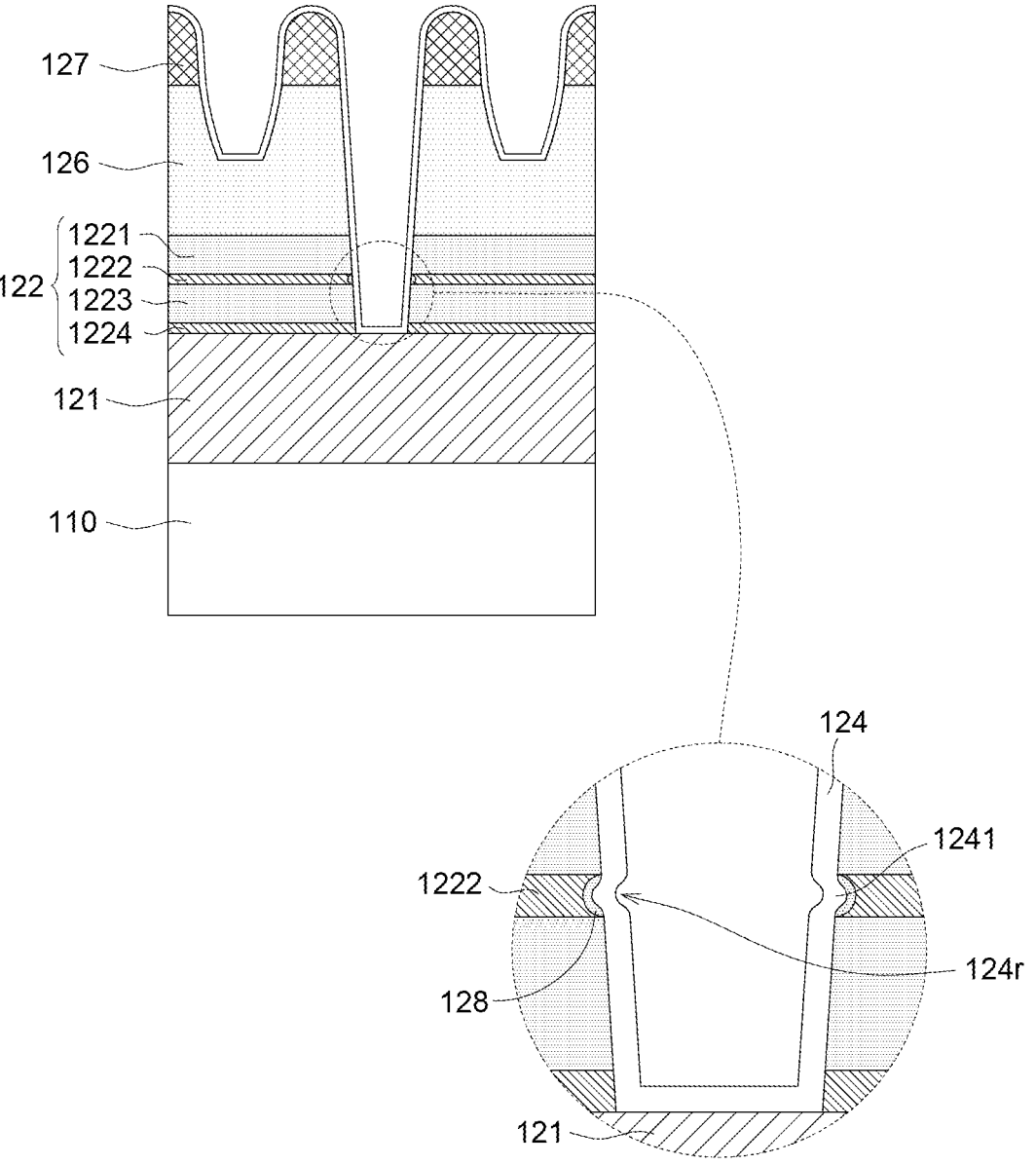

As illustrated in FIG. 3J, the barrier layer 124 over the lateral surface 122*s* of the ESL structure 122 and the filling portion 128 is formed by using deposition. The barrier layer 124 may conform to the shape of the first recess 122*r* or the second recess 128*r* to form a recess 124*r*. Due to the first depth d1 and/or the second depth d2 being smaller enough, the barrier layer 124 may be continuously formed on the lateral surface 122*s* of the ESL structure 122 and the filling portion 128. Furthermore, the barrier layer 12 may include a continuous portion 1241 corresponding to the first recess 122*r*. In another embodiment, the recess 124*r* may have a depth depending on the first depth d1 and/or the second depth d2, or even the barrier layer 124 may not have the recess 124*r*.

Then, the second conductive layer 125 filling the through via 123 and on the barrier layer 124 is formed by using metallozation, deposition, etc. So far, the semiconductor device 100 in FIG. 1 is formed.

The manufacturing method of the semiconductor device 200 in FIG. 2 includes the processes the same as or similar to that of the semiconductor device 100, and it will be not repeated here.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor device includes an ESL structure having a recess, wherein the recess has a depth ranging between 1 nm and 7 nm, and the semiconductor device further includes a barrier layer covering the recess to form a continuous portion.

Example embodiment 1: a semiconductor device includes a FEOL structure and a BEOL structure. The BEOL structure is formed over the FEOL structure and includes a conductive layer, an ESL structure, a through via and a barrier layer. The ESL structure is formed over the conductive layer and has a first recess and a lateral surface. The through via passes through the ESL structure to form the first recess and the lateral surface. The barrier layer covers the lateral surface and the first recess. The first recess is recessed with respect to the lateral surface, and the first recess has a first depth ranging between 1 nm and 7 nm.

Example embodiment 2 based on Example embodiment 1: the first depth less than 3 nm.

Example embodiment 3 based on Example embodiment 1: the barrier layer is a single and contiguous layer.

Example embodiment 4 based on Example embodiment 1: the ESL structure includes a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL; wherein the first ESL is formed from a material the same as that of the third ESL, and the second ESL is formed from a material the same as that of the fourth ESL.

Example embodiment 5 based on Example embodiment 1: the BEOL structure further includes a filling portion formed within the first recess, wherein the filling portion is formed from a material the same as that of a portion of the ESL structure.

Example embodiment 6 based on Example embodiment 4: the BEOL structure includes a filling portion formed within the first recess, wherein the filling portion is formed from a material the same as that of the first ESL and the third ESL of the ESL structure.

Example embodiment 7 based on Example embodiment 1: the BEOL structure further includes a filling portion formed within the first recess and having a second recess, wherein the second recess has a second depth less than the first depth.

Example embodiment 8: a semiconductor device includes a FEOL structure and a BEOL structure. The BEOL structure is formed over the FEOL structure and includes a conductive layer, an ESL structure, a through via and a barrier layer. The ESL structure is formed over the conductive layer and having a first recess and a lateral surface. The through via passes through the ESL structure to form the first recess and the lateral surface. The barrier layer covers the lateral surface and the first recess. The first recess is recessed with respect to the lateral surface, and the barrier layer comprises a continuous portion corresponding to the first recess.

Example embodiment 9 based on Example embodiment 8: the first recess has a first depth equal to or less than 3 nm.

Example embodiment 10 based on Example embodiment 9: the ESL structure includes a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL; the first ESL is formed from a material the same as that of the third ESL, and the second ESL is formed from a material the same as that of the fourth ESL.

Example embodiment 11 based on Example embodiment 8: the ESL structure includes a filling portion formed within the first recess. The filling portion is formed from a material the same as that of a portion of the ESL structure.

Example embodiment 12 based on Example embodiment 8: the ESL structure includes a filling portion formed within the first recess. The filling portion is formed from a material the same as that of the first ESL and the third ESL of the ESL structure.

Example embodiment 13 based on Example embodiment 8: the ESL structure includes a filling portion formed within the first recess and having a second recess. The second recess has a second depth less than the first depth.

Example embodiment 14: a manufacturing method for a semiconductor device includes the following steps: forming a FEOL structure; and forming a BEOL structure over the FEOL structure, comprising: forming an ESL structure over a conductive layer; forming a first hole to pass through a portion of the ESL structure, wherein the ESL structure forms a lateral surface and a first recess recessed with respect to the lateral surface; forming a barrier layer over the lateral surface and the first recess; forming a filling portion within the first recess; forming a second hole to pass through another portion of the ESL structure, wherein at least one portion of the filling portion is removed, and the second hole exposes the conductive layer; and forming a barrier layer to cover the lateral surface and the first recess, wherein the barrier layer comprises a continuous portion corresponding to the first recess.

Example embodiment 15 based on Example embodiment 14: in forming the ESL structure over the conductive layer, the ESL structure comprises a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL; wherein the first ESL is formed from a material the same as that of the third ESL, and the second ESL is formed from a material the same as that of the fourth ESL.

Example embodiment 16 based on Example embodiment 15: in forming the filling portion within the first recess, the first ESL and the third ESL may be bombarded by using a dry etching, wherein the filling portion is formed by a sputtered material of the first ESL and/or a sputtered material of the third ESL.

Example embodiment 17 based on Example embodiment 16: the dry etching is accomplished by Argon ion plasma.

Example embodiment 18 based on Example embodiment 16: the manufacturing method further includes: removing a portion of the third ESL, wherein at least one portion of the filling portion is removed.

Example embodiment 19 based on Example embodiment 14: in forming the filling portion within the first recess, the filling portion has a second recess having a second depth less than a first depth of the first recess.

Example embodiment 20 based on Example embodiment 14: after forming the second hole to pass through another portion of the ESL structure, the first recess has a first depth equal to or less than 3 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a semiconductor device, comprising:
   forming a FEOL structure; and
   forming a BEOL structure over the FEOL structure, comprising:
      forming an ESL structure over a conductive layer;
      forming a first hole to pass through a portion of the ESL structure, wherein the ESL structure forms a lateral surface and a first recess recessed with respect to the lateral surface;
      forming a barrier layer over the lateral surface and the first recess;
      forming a filling portion within the first recess;
      forming a second hole to pass through another portion of the ESL structure, wherein at least one portion of the filling portion is removed, and the second hole exposes the conductive layer.

2. The manufacturing method as claimed in claim 1, wherein in forming the ESL structure over the conductive layer, the ESL structure comprises a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL;
   wherein the first ESL is formed from a material the same as that of the third ESL, and the second ESL is formed from a material the same as that of the fourth ESL.

3. The manufacturing method as claimed in claim 2, wherein in forming the filling portion within the first recess, the first ESL and the third ESL are bombarded by using a dry etching, wherein the filling portion is formed by a sputtered material of the first ESL and/or a sputtered material of the third ESL.

4. The manufacturing method as claimed in claim 3, wherein the dry etching is accomplished by Argon ion plasma.

5. The manufacturing method as claimed in claim 3, further comprising:
   removing a portion of the third ESL, wherein at least one portion of the filling portion is removed.

6. The manufacturing method as claimed in claim 1, wherein in forming the filling portion within the first recess, the filling portion has a second recess having a second depth less than a first depth of the first recess.

7. The manufacturing method as claimed in claim 1, wherein after forming the second hole to pass through another portion of the ESL structure, the first recess has a first depth equal to or less than 3 nm.

8. The manufacturing method as claimed in claim 1, wherein in forming the barrier layer to cover the lateral surface and the first recess, the barrier layer comprises a continuous portion corresponding to the first recess.

9. A manufacturing method for a semiconductor device, comprising:
   forming a FEOL structure; and
   forming a BEOL structure over the FEOL structure, comprising:
      forming an ESL structure over a conductive layer;

forming a first hole to pass through a portion of the ESL structure, wherein the ESL structure forms a lateral surface and a first recess recessed with respect to the lateral surface;

forming a barrier layer over the lateral surface and the first recess;

forming a filling portion within the first recess;

forming a second hole to pass through another portion of the ESL structure, wherein at least one portion of the filling portion is removed, and the second hole exposes the conductive layer; and wherein the first recess has a first depth ranging between 1 nm and 7 nm.

10. The manufacturing method as claimed in claim 9, wherein in forming the ESL structure over the conductive layer, the ESL structure comprises a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL;

wherein the first ESL is formed from a material the same as that of the third ESL, and the second ESL is formed from a material the same as that of the fourth ESL.

11. The manufacturing method as claimed in claim 10, wherein in forming the filling portion within the first recess, the first ESL and the third ESL are bombarded by using a dry etching, wherein the filling portion is formed by a sputtered material of the first ESL and/or a sputtered material of the third ESL.

12. The manufacturing method as claimed in claim 11, wherein the dry etching is accomplished by Argon ion plasma.

13. The manufacturing method as claimed in claim 11, further comprising:

removing a portion of the third ESL, wherein at least one portion of the filling portion is removed.

14. The manufacturing method as claimed in claim 9, wherein in forming the filling portion within the first recess, the filling portion has a second recess having a second depth less than a first depth of the first recess.

15. The manufacturing method as claimed in claim 9, wherein after forming the second hole to pass through another portion of the ESL structure, the first recess has a first depth equal to or less than 3 nm.

16. A manufacturing method for a semiconductor device, comprising:

forming a FEOL structure; and forming a BEOL structure over the FEOL structure, comprising:

forming an ESL structure over a conductive layer;

forming a first hole to pass through a portion of the ESL structure, wherein the ESL structure forms a lateral surface and a first recess recessed with respect to the lateral surface;

forming a barrier layer over the lateral surface and the first recess;

forming a filling portion within the first recess;

forming a second hole to pass through another portion of the ESL structure, wherein at least one portion of the filling portion is removed, and the second hole exposes the conductive layer; and wherein the barrier layer is a single and contiguous layer.

17. The manufacturing method as claimed in claim 16, wherein in forming the ESL structure over the conductive layer, the ESL structure comprises a first ESL, a second ESL, a third ESL and a fourth ESL, wherein the second ESL is formed between the first ESL and the third ESL, the third ESL is formed between the second ESL and the fourth ESL, the fourth ESL is formed between the conductive layer and the third ESL, and the first recess is formed corresponding to the second ESL;

wherein the first ESL is formed from a material the same as that of the third ESL, and the second ESL is formed from a material the same as that of the fourth ESL.

18. The manufacturing method as claimed in claim 17, wherein in forming the filling portion within the first recess, the first ESL and the third ESL are bombarded by using a dry etching, wherein the filling portion is formed by a sputtered material of the first ESL and/or a sputtered material of the third ESL.

19. The manufacturing method as claimed in claim 18, wherein the dry etching is accomplished by Argon ion plasma.

20. The manufacturing method as claimed in claim 18, further comprising:

removing a portion of the third ESL, wherein at least one portion of the filling portion is removed.

\* \* \* \* \*